US012563970B2

(12) United States Patent
Pibre et al.

(10) Patent No.: US 12,563,970 B2
(45) Date of Patent: Feb. 24, 2026

(54) PIEZOELECTRIC DEVICE HAVING IMPROVED PIEZOELECTRIC PROPERTIES

(71) Applicant: COMPAGNIE GENERALE DES ETABLISSEMENTS MICHELIN, Clermont-Ferrand (FR)

(72) Inventors: Guillaume Pibre, Clermont-Ferrand (FR); Francois Lafort, Clermont-Ferrand (FR)

(73) Assignee: COMPAGNIE GENERALES DES ETABLISSEMENTS MICHELIN, Clermont-Ferrand (FR)

( * ) Notice: Subject to any disclaimer, the term of this patent is extended or adjusted under 35 U.S.C. 154(b) by 748 days.

(21) Appl. No.: 17/788,341

(22) PCT Filed: Dec. 16, 2020

(86) PCT No.: PCT/FR2020/052471
§ 371 (c)(1),
(2) Date: Jun. 23, 2022

(87) PCT Pub. No.: WO2021/130435
PCT Pub. Date: Jul. 1, 2021

(65) Prior Publication Data
US 2023/0122032 A1 Apr. 20, 2023

(30) Foreign Application Priority Data
Dec. 23, 2019 (FR) ...................................... 1915446

(51) Int. Cl.
*H10N 30/85* (2023.01)
*C08K 3/04* (2006.01)
(Continued)

(52) U.S. Cl.
CPC .............. *H10N 30/852* (2023.02); *C08K 3/04* (2013.01); *C08K 3/22* (2013.01); *C08K 5/14* (2013.01);
(Continued)

(58) Field of Classification Search
CPC ...... H10N 30/852; H10N 30/878; C08K 3/04; C08K 3/22; C08K 5/14; C08K 2003/2206; C08K 2003/2237; B60C 19/00
See application file for complete search history.

(56) References Cited

U.S. PATENT DOCUMENTS 8,138,246 B2 3/2012 Kato et al.
11,545,614 B2 1/2023 Guhathakurta et al.
(Continued)

FOREIGN PATENT DOCUMENTS

CN 106750656 A 5/2017
CN 110199399 A 9/2019
(Continued)

OTHER PUBLICATIONS

Machine Translation of KR101322838, Univ Kyung Hee Univ Ind Coop Group, Oct. 28, 2013.*
(Continued)

*Primary Examiner* — Emily P Pham
(74) *Attorney, Agent, or Firm* — VENABLE LLP

(57) ABSTRACT
A piezoelectric device comprises at least one piezoelectric layer P interposed between two conductive layers E, each layer E forming an electrode, characterized in that the layer P comprises at least one piezoelectric composition based on at least one elastomer matrix comprising predominantly at least one diene elastomer, a piezoelectric inorganic filler, a carbon black and a crosslinking system, and in that the content of piezoelectric inorganic filler is greater than or
(Continued)

equal to 5% by volume, relative to the total volume of the piezoelectric composition, and the content of carbon black is greater than or equal to 6% by volume, relative to the total volume of the piezoelectric composition. A tire comprising at least one piezoelectric device defined above is also set forth.

15 Claims, 1 Drawing Sheet

(51) Int. Cl.
*C08K 3/22* (2006.01)
*C08K 5/14* (2006.01)
*B60C 19/00* (2006.01)
(52) U.S. Cl.
CPC ...... *B60C 19/00* (2013.01); *C08K 2003/2206* (2013.01); *C08K 2003/2237* (2013.01)

(56) References Cited

U.S. PATENT DOCUMENTS

| | | | |
|---|---|---|---|
| 2009/0293590 A1 | 12/2009 | Zeng et al. | |
| 2010/0035158 A1 | 2/2010 | Kato et al. | |
| 2015/0134061 A1 | 5/2015 | Friis et al. | |
| 2019/0058108 A1 | 2/2019 | Guhathakurta et al. | |
| 2019/0284423 A1 | 9/2019 | Bodkhe et al. | |
| 2019/0334078 A1 | 10/2019 | Araujo Da Silva et al. | |
| 2020/0303621 A1 | 9/2020 | Guhathakurta et al. | |
| 2021/0245553 A1 | 8/2021 | Lafort et al. | |
| 2021/0257538 A1 | 8/2021 | Lafort et al. | |
| 2022/0402312 A1* | 12/2022 | Mangone | C08K 3/04 |
| 2023/0049031 A1 | 2/2023 | Pibre et al. | |

FOREIGN PATENT DOCUMENTS

| | | |
|---|---|---|
| CN | 112313084 A | 2/2021 |
| EP | 2071584 A1 | 6/2009 |
| EP | 2654094 A1 | 10/2013 |
| JP | 2013-21176 A | 1/2013 |
| JP | 2016-65209 A | 4/2016 |
| KR | 10-1322838 B1 | 10/2013 |
| WO | 97/36724 A2 | 10/1997 |
| WO | 99/16600 A1 | 4/1999 |
| WO | 2016/157092 A1 | 10/2016 |
| WO | 2019/243749 A1 | 12/2019 |
| WO | 2019/243750 A1 | 12/2019 |

OTHER PUBLICATIONS

International Search Report dated Feb. 11, 2021, in corresponding PCT/FR2020/052471 (4 pages).
J. Capsal, et al., "Nanotexture influence of BaTiO3 particles on piezoelectric behaviour of PA 11/BaTiO3 nanocomposites", J. Non-Crystalline Solids 356 (2010) 629-634.
T. Furukawa, et al., "Electromechanical Properties in the Composites of Epoxy Resin and PZT Ceramics", Japanese J. Appl. Phys., vol. 15, No. 11, pp. 2119-2129 (1976).
K.A. Hanner, et al., "Thin Film 0-3 Polymer/Piezoelectric Ceramic Composites: Piezoelectric Paints", Ferroelectrics, 1989, vol. 100, pp. 255-260.
X. Liu, et al., "Piezoelectric and dielectric properties of PZT/PVC and graphite doped with PZT/PVC composites", Materials Science and Engineering B 127 (2006) 261-266.
G. Rujijanagul, et al., "Effect of the particle size of PZT on the microstructure and the piezoelectric properties of 0-3 PZT/polymer composites", J. Materials Science Letters 20, 2001, 1943-1945.
F. Vilmin, et al., "Fast and Robust Method for the Determination of Microstructure and Composition in Butadiene, Styrene-Butadiene, and Isoprene Rubber by Near-Infrared Spectroscopy", Applied Spectroscopy, vol. 60, No. 6, pp. 619-630 (2006).
J. Pernak, et al., "Ionic liquids „in a nutshell" (history, properties and development), Chemik 2016, 70, 9, 471-480.
S.M. Villa, et al., "Soft Piezoionic/Piezoelectric Nanocomposites Based on Ionogel/BaTiO3 Nanoparticles for Low Frequency and Directional Discriminative Pressure Sensing", ACS Macro Lett. 2019, 8, 414-420.

* cited by examiner

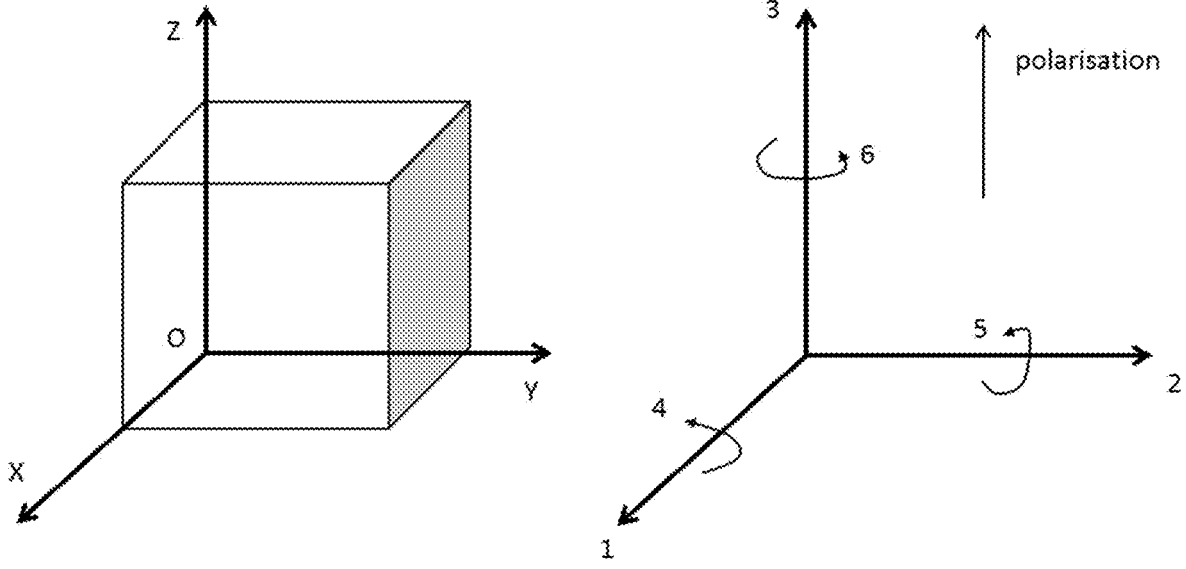

PIEZOELECTRIC DEVICE HAVING IMPROVED PIEZOELECTRIC PROPERTIES

TECHNICAL FIELD

The present invention relates to a piezoelectric device comprising at least one piezoelectric layer P of a piezoelectric composition interposed between two conductive electrodes.

PRIOR ART

Many articles comprise piezoelectric composite materials for their operation. Specifically, they can be found in acoustic transducers, in pressure and/or acceleration sensors, energy generators, sound-insulating materials, in piezoelectric detectors and/or actuators used for example in atomic force electron microscopy or else used in tyres for monitoring the behaviour thereof.

Piezoelectricity is a physical phenomenon which corresponds to the appearance of an electrical polarization induced by an external mechanical deformation. It is an electromechanical coupling where the polarization is proportional to the mechanical stress applied up to a certain level. The piezoelectric effect is then said to be direct. This phenomenon is reversible: when the material is subjected to an external electric field, it is deformed. This is the inverse piezoelectric effect.

A variation in the macroscopic polarization when applying a stress to the sample characterizes the piezoelectric effect. In a system of orthogonal axes, the polarization and the stress are linked in matrix notation by a 2nd rank tensor referred to as piezoelectric tensor $d_{ij}$ with i and j respectively corresponding to the axis of polarization (1, 2, 3) and of application of the stress (1, 2, 3, 4, 5, 6) as shown in FIG. 1.

Materials having piezoelectric properties are classified into three broad classes: inorganic piezoelectric materials, piezoelectric polymers, and piezoelectric composite materials.

These three broad classes of piezoelectric materials in particular do not have the same properties of dielectric permittivity, remanent polarization, coercive field, and the like.

The properties of inorganic piezoelectric materials, such as for example lead zirconate titanates (PZTs), are very often linked to their crystalline structure, whereas those of piezoelectric polymers (organic materials) originate from the presence of permanent dipoles intrinsic to the monomers which make up these polymers. The best-known piezoelectric polymer is PVDF.

A piezoactive or piezoelectric composite material comprises at least one piezoelectric material, which gives the composite material its piezoelectric activity, and one or more non-piezoelectric phases. This combination results in a composite material having enhanced performance qualities compared to each phase alone. The non-piezoelectric phase is generally an organic polymer matrix, in particular a rigid thermoplastic or thermosetting polymer matrix (US2015134061, WO2016/157092), which may be of polyamide type (Capsal et al. Journal of non-crystalline solids 2010, 356, 629-634), polyepoxy type (Furukawa et al. Jpn. J. Appl. Phys., 1976, 15, 2119), polystyrene type, polyurethane type (Hanner et al., Ferroelectrics, 1989, 100, 255-260), PVC type (Liu et al., Materials Science and Engineering, 2006, 127, 261-266) or else polyethylene type (Rujijanagul et al., Journal of Materials Science Letters, 2001, 20, 1943-1945), a polymeric matrix comprising cyanoethylated polyvinyl alcohol (EP 2654094), or a polymeric matrix comprising a diene elastomer (PCT/FR2019/051514).

Piezoelectric properties are used in many applications with increasing miniaturization, which requires the provision of devices having increasingly great piezoelectric properties.

An object of the present invention is therefore to find a solution to this need and to propose a novel device comprising a piezoelectric composition the piezoelectric properties of which are improved compared to prior art piezoelectric composite materials.

The applicant has found that the addition of a carbon black to a piezoelectric composition makes it possible, surprisingly, to improve its piezoelectric properties.

SUMMARY OF THE INVENTION

Thus, one subject of the invention is a piezoelectric device comprising at least one piezoelectric layer P interposed between two conductive layers E, each layer E forming an electrode, characterized in that the layer P comprises at least one piezoelectric composition based on at least one elastomer matrix comprising predominantly at least one diene elastomer, a piezoelectric inorganic filler, a carbon black and a crosslinking system, and in that the content of piezoelectric inorganic filler is greater than or equal to 5% by volume, relative to the total volume of the piezoelectric composition, and the content of carbon black is greater than or equal to 6% by volume, relative to the total volume of the piezoelectric composition.

Preferentially, the carbon black is a reinforcing carbon black.

Preferentially, the carbon black has an oil absorption number OAN of less than or equal to 154 ml/100 g, more preferentially within a range extending from 35 to 150 ml/100 g, more preferentially still extending from 70 to 140 ml/100 g.

Preferentially, the carbon black has a BET specific surface area of greater than 30 $m^2/g$, preferably within a range extending from 70 to 150 $m^2/g$, more preferentially still within a range extending from 70 to 120 $m^2/g$.

Preferentially, the carbon black has an oil absorption number OAN within a range extending from 35 to 150 ml/100 g and has a BET specific surface area within a range extending from 70 to 150 $m^2/g$.

Preferentially, the content of carbon black is greater than or equal to 6.5% by volume, relative to the total volume of the piezoelectric composition, and more preferentially greater than or equal to 7%.

Preferentially, the content of carbon black is less than or equal to 25% by volume, relative to the total volume of the piezoelectric composition, more preferentially less than or equal to 20% by volume, and more preferentially still less than or equal to 17% by volume.

Preferentially, the content of carbon black is within a range extending from 6% to 20% by volume, relative to the total volume of the piezoelectric composition.

Preferentially, the content of piezoelectric inorganic filler is within a range extending from 5% to 80% by volume, relative to the total volume of the piezoelectric composition, preferably extending from 6% to 60% and more preferentially still extending from 7% to 50%.

Preferentially, the piezoelectric inorganic filler is selected from piezoelectric ceramics, advantageously from ferroelectric oxides, advantageously having a perovskite structure.

Preferentially, the piezoelectric inorganic filler is selected from the group consisting of barium titanate, lead titanate, lead zirconate titanate, lead niobate, lithium niobate, potassium niobate, and mixtures thereof; more preferentially, the piezoelectric inorganic filler is selected from the group consisting of barium titanate, lead zirconate titanate, potassium niobate, and mixtures thereof.

Preferentially, the piezoelectric inorganic filler is selected from the group consisting of barium titanate, potassium niobate, and mixtures thereof.

Preferentially, the size of the particles of the piezoelectric inorganic filler is within a range extending between 50 nm and 800 μm.

Preferentially, the piezoelectric composition comprises from 75 phr to 100 phr, more preferentially from 90 phr to 100 phr, and more preferentially still from 95 to 100 phr, of diene elastomer.

Preferentially, the diene elastomer of the piezoelectric composition is selected from the group consisting of natural rubber, copolymers of dienes and of α-olefins, synthetic polyisoprenes, polybutadienes, butadiene copolymers, isoprene copolymers, and mixtures of these diene elastomers.

Preferentially, the diene elastomer of the piezoelectric composition is selected from the group consisting of natural rubber, ethylene/propylene/diene monomer copolymers, synthetic polyisoprenes, polybutadienes, butadiene/styrene copolymers, butadiene/isoprene copolymers, butadiene/styrene/isoprene copolymers, isoprene/styrene copolymers, and mixtures of these diene elastomers.

Preferentially, the diene elastomer of the piezoelectric composition is selected from the group consisting of polybutadienes, butadiene/styrene copolymers, butadiene/isoprene copolymers, butadiene/styrene/isoprene copolymers, and mixtures of these diene elastomers; more preferentially, the diene elastomer is the styrene/butadiene copolymer.

Preferentially, the crosslinking system of the piezoelectric composition comprises a peroxide.

Preferentially, the layer P is an electrically insulating piezoelectric layer.

Preferentially, each layer E is a conductive metal layer.

Preferentially, the metal of the layer E is selected from the group consisting of silver, gold, nickel, palladium, aluminium, copper, titanium, and a mixture thereof, and preferably is gold.

Preferentially, each layer E is a conductive rubber composition based on at least 50 phr of diene elastomer, a graphitized or partially graphitized carbon black and a crosslinking system.

Preferentially, the content of graphitized or partially graphitized carbon black in the conductive rubber composition of the layer E is within a range extending from 10% to 40% by volume, relative to the total volume of the conductive rubber composition of the layer E, and preferentially within a range extending from 15% to 30% by volume.

Preferentially, the crosslinking system of the conductive rubber composition of the layer E comprises a peroxide.

Preferentially, the diene elastomer of the piezoelectric composition of the layer E is co-crosslinked with the diene elastomer of the conductive rubber composition of each layer P.

Preferentially, the graphitized or partially graphitized carbon black of the conductive rubber composition of the layer E has an oil absorption number OAN of greater than or equal to 155 ml/100 g.

Another subject of the present invention relates to a tyre comprising at least one piezoelectric device defined above.

4

BRIEF DESCRIPTION OF THE DRAWINGS

FIG. 1 is a representation of the system of orthogonal axes for the polarization, P, and the stress. The indices 1, 2, 3 respectively correspond to the directions normal to the planes YOZ, XOZ and XOY, and the indices 4, 5, 6 to the directions tangential to these same planes.

DETAILED DESCRIPTION

The invention relates to a piezoelectric device comprising at least one piezoelectric layer P interposed between two conductive layers E, each layer E forming an electrode, characterized in that the layer P comprises at least one piezoelectric composition based on at least one elastomer matrix comprising predominantly at least one diene elastomer, a piezoelectric inorganic filler, a carbon black and a crosslinking system, and in that the content of piezoelectric inorganic filler is greater than or equal to 5% by volume, relative to the total volume of the piezoelectric composition, and the content of carbon black is greater than or equal to 6% by volume, relative to the total volume of the piezoelectric composition.

In the present description, any interval of values denoted by the expression "from a to b" represents the range of values extending from a up to b (that is to say, limits a and b included). Any interval "between a and b" represents the range of values extending from more than a to less than b (that is to say, limits a and b excluded).

When reference is made to a "predominant" compound, this is understood to mean, within the meaning of the present invention, that this compound is predominant among the compounds of the same type in the composition, that is to say that it is the one which represents the greatest amount by weight among the compounds of the same type. Thus, for example, a predominant elastomer is the elastomer representing the greatest weight relative to the total weight of the elastomers in the composition. In the same way, a "predominant" filler is that representing the greatest weight among the fillers of the composition. By way of example, in a system comprising just one elastomer, the latter is predominant within the meaning of the present invention and, in a system comprising two elastomers, the predominant elastomer represents more than half of the weight of the elastomers. Preferably, the term "predominant" is understood to mean present at more than 50%, preferably more than 60%, 70%, 80%, 90%, and more preferentially the "predominant" compound represents 100%.

The expression "consists essentially of", followed by one or more features, means that, in addition to the components or steps explicitly recited, components or steps which do not significantly modify the properties and the features of the invention may be included in the process or the material of the invention.

The expression "part by weight per hundred parts by weight of elastomer" (or phr) should be understood as meaning, within the meaning of the present invention, the part by weight per hundred parts by weight of elastomers, whether or not they are thermoplastic. In other words, thermoplastic elastomers are elastomers.

The compounds mentioned in the description and participating in the preparation of rubber compositions or polymers can be of fossil or biobased origin. In the latter case, they may be partially or completely derived from biomass or be obtained from renewable starting materials derived from biomass. Polymers, fillers and the like are concerned in particular.

Layer P

The layer P of the device according to the invention comprises at least one, in particular consists preferentially of a, piezoelectric composition based on at least one elastomer matrix comprising predominantly at least one diene elastomer, a piezoelectric inorganic filler, a carbon black and a crosslinking system, and in that the content of piezoelectric inorganic filler is greater than or equal to 5% by volume, relative to the total volume of the piezoelectric composition, and the content of carbon black is greater than or equal to 6% by volume, relative to the total volume of the piezoelectric composition.

The term "piezoelectric composition" is understood to mean a composition based on at least one piezoelectric material, which gives the composition its piezoelectric activity, and based on one or more non-piezoelectric phases. This combination results in a composition having enhanced performance qualities compared to each phase alone.

The expression "piezoelectric composition based on" should be understood as meaning a piezoelectric composition comprising the mixture and/or the product of the in situ reaction of the various base constituents used, some of these constituents being able to react and/or being intended to react with one another, at least partially, during the various phases of manufacture of said composition, or during the subsequent curing, modifying said composition as it is prepared at the start. Thus, the piezoelectric compositions as employed for the invention can be different in the non-crosslinked state and in the crosslinked state.

Elastomer Matrix

The term "elastomer matrix" is understood to mean the elastomer or all of the elastomers which constitute the non-piezoelectric phase of the piezoelectric composition.

"Diene elastomer (or, without distinction, rubber)", whether natural or synthetic, should be understood, in a known way, as meaning an elastomer composed, at least in part (i.e. a homopolymer or a copolymer), of diene monomer units (monomers bearing two conjugated or non-conjugated carbon-carbon double bonds).

These diene elastomers can be classified into two categories: "essentially unsaturated" or "essentially saturated". The term "essentially unsaturated" is understood to mean generally a diene elastomer resulting at least in part from conjugated diene monomers having a content of units of diene origin (conjugated dienes) which is greater than 15% (mol %); thus, diene elastomers such as butyl rubbers or copolymers of dienes and of α-olefins of EPDM type do not come within the preceding definition and can in particular be described as "essentially saturated" diene elastomers (low or very low content, always less than 15 mol %, of units of diene origin).

As diene elastomer capable of being used in the elastomer matrix of the piezoelectric composition in accordance with the invention, the following are suitable:

any homopolymer of a conjugated or non-conjugated diene monomer having from 4 to 18 carbon atoms;

any copolymer of a conjugated or non-conjugated diene having from 4 to 18 carbon atoms and of at least one other monomer.

The other monomer of the copolymer of a diene may be ethylene, an olefin or a conjugated or non-conjugated diene.

Suitable as conjugated dienes are conjugated dienes having from 4 to 12 carbon atoms, especially 1,3-dienes, such as, in particular, 1,3-butadiene and isoprene.

Suitable as non-conjugated dienes are non-conjugated dienes having from 6 to 12 carbon atoms, such as 1,4-hexadiene, ethylidenenorbornene or dicyclopentadiene.

Suitable as olefins are vinylaromatic compounds having from 8 to 20 carbon atoms and aliphatic α-monoolefins having from 3 to 12 carbon atoms.

Suitable as vinylaromatic compounds are, for example, styrene, ortho-, meta- or para-methylstyrene, the "vinyltoluene" commercial mixture or para-(tert-butyl)styrene.

Suitable as aliphatic α-monoolefins are in particular acyclic aliphatic α-monoolefins having from 3 to 18 carbon atoms.

More particularly, the diene elastomer is:

any homopolymer of a conjugated diene monomer, in particular any homopolymer obtained by polymerization of a conjugated diene monomer having from 4 to 12 carbon atoms;

any copolymer obtained by copolymerization of one or more conjugated dienes with one another or with one or more vinylaromatic compounds having from 8 to 20 carbon atoms;

any copolymer obtained by copolymerization of one or more conjugated or non-conjugated dienes with ethylene, an α-monoolefin, or a mixture thereof, such as, for example, the elastomers obtained from ethylene, from propylene with a non-conjugated diene monomer of the abovementioned type.

Preferentially, the diene elastomer is selected from the group consisting of natural rubber (NR), copolymers of dienes and of α-olefins, synthetic polyisoprenes (IRs), polybutadienes (BRs), butadiene copolymers, isoprene copolymers, and mixtures of these diene elastomers. Mention will in particular be made, among the isoprene copolymers, of isobutene/isoprene (butyl rubber—IIR), isoprene/styrene (SIR), isoprene/butadiene (BIR) or isoprene/butadiene/styrene (SBIR) copolymers. Mention will in particular be made, among the butadiene copolymers, of butadiene/styrene (SBR), isoprene/butadiene (BIR) or isoprene/butadiene/styrene (SBIR) copolymers. Among the copolymers of dienes and of α-olefins, ethylene/propylene/diene monomer (EPDM) copolymers are preferred.

More preferentially still, the diene elastomer is selected from the group consisting of natural rubber, ethylene/propylene/diene monomer copolymers, synthetic polyisoprenes, polybutadienes, styrene/butadiene copolymers, isoprene/styrene copolymers, isoprene/butadiene/styrene copolymers, isoprene/butadiene copolymers, and mixtures of these diene elastomers.

More preferentially still, the diene elastomer is a styrene/butadiene copolymer. Suitable in particular are butadiene/styrene copolymers and in particular those having a Tg (glass transition temperature, Tg, measured according to ASTM D3418-1999) of between 0° C. and −90° C. and more particularly between −10° C. and −70° C., a styrene content of between 1% and 60% by weight and more particularly between 20% and 50%, a content (mol %) of 1,2-bonds of the butadiene part of between 4% and 75% and a content (mol %) of trans-1,4-bonds of between 10% and 80%.

The diene elastomer may be modified, that is to say either coupled and/or star-branched, or functionalized, or coupled and/or star-branched and simultaneously functionalized.

Thus, the diene elastomer may be coupled and/or star-branched, for example by means of a silicon or tin atom which connects the elastomer chains together.

The diene elastomer may be simultaneously or alternatively functionalized and comprise at least one functional group. The term "functional group" is understood to mean a group comprising at least one heteroatom chosen from Si, N, S, O or P. Particularly suitable as functional groups are those comprising at least one function such as: silanol, an alkoxysilane, a primary, secondary or tertiary amine which is cyclic or non-cyclic, a thiol or an epoxide.

In the context of functionalized elastomers, that is to say elastomers comprising at least one functional group:

The functional group can be located at the end of the elastomer chain; it will then be said that the diene elastomer is functionalized at the chain end;

The functional group can be located in the main linear elastomer chain; it will then be said that the diene elastomer is coupled or else functionalized in the middle of the chain, in contrast to the position "at the chain end", although the group is not located precisely in the middle of the main elastomer chain;

The functional group can be central and connect n elastomer chains (n>2), the elastomer being star-branched or branched;

The diene elastomer can comprise several functional groups, which are or are not pendant, distributed along the main chain of the elastomer; it will then be said that the diene elastomer is functionalized along the chain.

The elastomer matrix may contain just one diene elastomer or a mixture of several diene elastomers.

Preferentially, the elastomer matrix comprises from 75 to 100 phr of diene elastomer (phr=part by weight relative to 100 parts by weight of elastomer), more advantageously from 90 to 100 phr, and even more advantageously from 95 to 100 phr. In a preferred alternative form of the invention, the diene elastomer, or the mixture of diene elastomers, is the only elastomer of the elastomer matrix (thus corresponding to 100 phr).

In an alternative form of the invention, the piezoelectric composition of the layer P can comprise another elastomer, in a content strictly of less than 50 phr.

This other elastomer may in particular be a thermoplastic elastomer (abbreviated to "TPE").

TPEs have a structure intermediate between elastomers and thermoplastic polymers. They are block copolymers consisting of rigid thermoplastic blocks connected by flexible elastomer blocks.

The thermoplastic elastomer used for the implementation of the invention is a block copolymer, the chemical nature of the thermoplastic blocks and elastomer blocks of which can vary.

In a known way, TPEs exhibit two glass transition temperature (Tg, measured according to ASTM D3418-1999) peaks, the lowest temperature relating to the elastomer part of the TPE and the highest temperature relating to the thermoplastic part of the TPE. Thus, the flexible blocks of the TPEs are defined by a Tg which is below ambient temperature (25° C.), while the rigid blocks have a Tg above 80° C.

In order to be both elastomeric and thermoplastic in nature, the TPE has to be provided with blocks which are sufficiently incompatible (that is to say, different as a result of their respective masses, of their respective polarities or of their respective Tg values) to retain their own properties of elastomer or thermoplastic block.

The TPEs can be copolymers with a small number of blocks (less than 5, typically 2 or 3), in which case these blocks preferably have high weights of greater than 15 000 g/mol. These TPEs can, for example, be diblock copolymers, comprising a thermoplastic block and an elastomer block. These are often also triblock elastomers with two rigid segments connected by a flexible segment. The rigid and flexible segments can be positioned linearly, or in a star-branched or branched configuration. Typically, each of these segments or blocks often contains a minimum of more than 5, generally of more than 10, base units (for example styrene units and butadiene units for a styrene/butadiene/styrene block copolymer).

The TPEs can also comprise a large number of smaller blocks (more than 30, typically from 50 to 500), in which case these blocks preferably have relatively low weights, for example from 500 to 5000 g/mol; these TPEs will be referred to subsequently as multiblock TPEs and are an elastomer block/thermoplastic block sequence.

The elastomer blocks of the TPE for the requirements of the invention can be any of the elastomers described above for the diene elastomer. They preferably have a Tg of less than 25° C., preferentially of less than 10° C., more preferentially of less than 0° C. and very preferentially of less than –10° C. Also preferentially, the elastomer block Tg of the TPE is greater than –100° C.

Use will be made, for the definition of the thermoplastic blocks, of the characteristic of glass transition temperature (Tg) of the rigid thermoplastic block. This characteristic is well known to those skilled in the art. It makes it possible in particular to choose the industrial processing (transformation) temperature. In the case of an amorphous polymer (or polymer block), the processing temperature is chosen to be substantially greater than the Tg. In the specific case of a semi-crystalline polymer (or polymer block), a melting point may be observed which is then greater than the glass transition temperature. In this case, it is instead the melting point (Tm) which makes it possible to choose the processing temperature for the polymer (or polymer block) under consideration. Thus, subsequently, when reference is made to "Tg (or Tm, if appropriate)", it should be considered that this is the temperature used to choose the processing temperature.

For the requirements of the invention, the TPE elastomers comprise one or more thermoplastic block(s) preferably having a Tg (or Tm, if appropriate) of greater than or equal to 80° C. and formed from polymerized monomers. Preferentially, this thermoplastic block has a Tg (or Tm, if appropriate) within a range varying from 80° C. to 250° C. Preferably, the Tg (or Tm, if appropriate) of this thermoplastic block is preferentially from 80° C. to 200° C., more preferentially from 80° C. to 180° C.

The proportion of the thermoplastic blocks, with respect to the TPE as defined for the implementation of the invention, is determined, on the one hand, by the thermoplasticity properties which said copolymer has to exhibit. The thermoplastic blocks having a Tg (or Tm, if appropriate) of greater than or equal to 80° C. are preferentially present in proportions sufficient to retain the thermoplastic nature of the elastomer. The minimum content of thermoplastic blocks having a Tg (or Tm, if appropriate) of greater than or equal to 80° C. in the TPE can vary as a function of the conditions of use of the copolymer. On the other hand, the ability of the TPE to deform can also contribute to determining the proportion of the thermoplastic blocks having a Tg (or Tm, if appropriate) of greater than or equal to 80° C.

By way of example, it is possible to use, for the elastomer matrix of the piezoelectric composition, any TPE which is a copolymer the elastomer part of which is saturated, and which comprises styrene blocks and alkylene blocks. The alkylene blocks are preferentially of ethylene, propylene or butylene. More preferentially, this TPE elastomer is selected from the following group, consisting of diblock or triblock copolymers which are linear or star-branched: styrene/ethylene/butylene (SEB), styrene/ethylene/propylene (SEP), styrene/ethylene/ethylene/propylene (SEEP), styrene/ethylene/butylene/styrene (SEBS), styrene/ethylene/propylene/ styrene (SEP S), styrene/ethylene/ethylene/propylene/styrene (SEEPS), styrene/isobutylene (SIB), styrene/isobutylene/styrene (SIBS) and the mixtures of these copolymers.

According to another example, it is possible to use any TPE which is a copolymer the elastomer part of which is unsaturated, and which comprises styrene blocks and diene blocks, these diene blocks being in particular isoprene or butadiene blocks. More preferentially, this TPE elastomer is selected from the following group, consisting of diblock or triblock copolymers which are linear or star-branched: styrene/butadiene (SB), styrene/isoprene (SI), styrene/butadiene/isoprene (SBI), styrene/butadiene/styrene (SBS), styrene/isoprene/styrene (SIS), styrene/butadiene/isoprene/styrene (SBIS) and the mixtures of these copolymers.

For example again, the TPE can be a linear or star-branched copolymer the elastomer part of which comprises a saturated part and an unsaturated part, such as, for example, styrene/butadiene/butylene (SBB), styrene/butadiene/butylene/styrene (SBBS) or a mixture of these copolymers.

Mention may be made, among the multiblock TPEs, of the copolymers comprising random copolymer blocks of ethylene and propylene/polypropylene, polybutadiene/polyurethane (TPU), polyether/polyester (COPE) or polyether/polyamide (PEBA).

Mention may be made, as examples of commercially available TPE elastomers, of the elastomers of SEPS, SEEPS or SEBS type sold by Kraton under the name Kraton G (G1650, G1651, G1654 and G1730 products) or Kuraray under the name Septon (Septon 2007, Septon 4033 or Septon 8004), or the elastomers of SIS type sold by Kuraray under the name Hybrar 5125 or sold by Kraton under the name D1161, or else the elastomers of linear SBS type sold by Polimeri Europa under the name Europrene SOL T 166 or of star-branched SBS type sold by Kraton under the name D1184. Mention may also be made of the elastomers sold by Dexco Polymers under the name Vector (Vector 4114 or Vector 8508). Mention may be made, among the multiblock TPEs, of the Vistamaxx TPE sold by Exxon; of the COPE TPE sold by DSM under the name Arnitel or by DuPont under the name Hytrel or by Ticona under the name Riteflex; of the PEBA TPE sold by Arkema under the name PEBAX; or of the TPU TPE sold by Sartomer under the name TPU 7840 or by BASF under the name Elastogran.

Piezoelectric Inorganic Fillers

The piezoelectric composition of the layer P comprises at least one piezoelectric inorganic filler in a content of greater than or equal to 5% by volume, relative to the total volume of said composition.

The piezoelectric inorganic filler may advantageously be dispersed in the elastomer matrix.

Advantageously, the piezoelectric inorganic filler may be in the form of particles which are not bonded to the elastomer matrix.

The expression "particles which are not bonded to the elastomer matrix" is understood to mean particles without covalent bonds between the piezoelectric inorganic filler and the elastomer(s) constituting the elastomer matrix of the piezoelectric composition.

The expression "particles dispersed in the elastomer matrix" is understood to mean that the piezoelectric inorganic filler used in the context of the present invention is distributed substantially uniformly in the elastomer matrix of the piezoelectric composition. Thus, the average distance separating adjacent particles of these piezoelectric inorganic fillers is substantially constant throughout the entire volume of said elastomer matrix.

These piezoelectric inorganic fillers may be piezoelectric single crystals or piezoelectric ceramics.

The piezoelectric single crystals are in particular natural piezoelectric materials, such as quartz or tourmaline. These crystals, which are ferroelectric, may have a domain structure. Monodomain single crystals and polydomain single crystals can be distinguished according to whether one or more polarization directions coexist in the crystal.

Advantageously, the piezoelectric inorganic filler used in the context of the invention may be selected from piezoelectric ceramics.

Piezoelectric ceramics are materials with strong electromechanical coupling and high density. These ceramics derive their piezoelectric property from their crystalline structure, through the absence of symmetry of the crystal unit cell, which splits up the centres of gravity of the positive and negative charges, each unit cell then constituting an electric dipole. The crystal unit cell thus has a permanent dipole which gives these ceramics high dielectric permittivity values. Synthetic piezoelectric ceramics are in particular composed of ferroelectric oxides, which have the property of possessing a spontaneous electric polarization, which can furthermore be reversed by the application of a sufficiently intense external electric field.

Advantageously, the piezoelectric inorganic filler may be selected from ferroelectric oxides.

The ferroelectric oxides may in particular be endowed with a perovskite structure. They advantageously correspond to a general formula $ABO_3$, such as barium titanate ($BaTiO_3$), lead titanate ($PbTiO_3$), potassium niobate ($KNbO_3$), lead niobate ($PbNbO_3$) or bismuth ferrite ($BiFeO_3$). In this family of piezoelectric materials, mention may also be made of lead zirconate titanate (PZT) with a $Pb(Zr_xTi_{1-x})O_3$ structure in which x is between 0 and 1. It may be in pure form or in the form of a semiconductor doped either with acceptor dopants (to give a "hard" PZT), such as Fe, Co, Mn, Mg, Al, In, Cr, Sc, Na or K, or with donor dopants (to give a "soft" PZT), such as La, Nd, Sb, Ta, Nb or W.

Advantageously, the piezoelectric inorganic fillers which can be used in the context of the invention have a perovskite structure.

By way of nonlimiting examples, the piezoelectric inorganic filler which can be used in the context of the invention may be selected from the group consisting of barium titanate, lead titanate, lead zirconate titanate (PZT), lead niobate, lithium niobate, potassium niobate, and mixtures thereof.

The most well-known piezoelectric ceramics are barium titanate ($BaTiO_3$) and lead zirconate titanate (PZT), which have a very good electromechanical coefficient and offer a variety of manufacturing processes. The latter (sol-gel process, hydrothermal synthesis, calcination, and the like) make it possible to modify the dielectric, mechanical and piezoelectric properties depending on the application targeted. Both barium titanate and potassium niobate are lead-free piezoelectric materials. They have the advantage of being less toxic.

Advantageously, the piezoelectric inorganic filler may be selected from barium titanate, potassium niobate, lead zirconate titanate, and mixtures thereof. More preferentially still, the piezoelectric inorganic filler is selected from barium titanate, potassium niobate, and mixtures thereof.

In particular, the piezoelectric inorganic fillers have particle sizes of between 50 nm and 800 The size of the particles corresponds to the average diameter of the particles. The measurement of the average diameter is performed by scanning electron microscopy (SEM) analysis. Images are taken on powder samples. Image analysis is carried out using software and makes it possible to obtain the average diameter of the particles present.

The volume of piezoelectric inorganic filler used in the layer P of the device of the invention will depend on the use of said device.

Preferentially, the content of piezoelectric inorganic filler is within a range extending from 5% to 80% by volume, relative to the total volume of the piezoelectric composition, advantageously within a range extending from 6% to 60% by volume, and more advantageously still from 7% to 50% by volume.

Advantageously, the layer P is of 0-3 connectivity, comprising particles of piezoelectric inorganic fillers dispersed in the elastomer matrix. The connectivity depends on the spatial organization of each constituent phase of the piezoelectric composition. A change in connectivity results in major changes in the physical properties of the composites. In the case of two-phase systems, the nature of the connectivity is represented by two numbers (the first for the ceramic, the second for the matrix). They indicate the number of directions connected by the phase under consideration. Thus, a 0-3 connectivity composite corresponds to a composite consisting of piezoelectric powder grains dispersed in the elastomer matrix. The main advantage of this type of composition is the ease of implementation of the process, or else the ease of producing complex shapes, such as curved surfaces.

Carbon Black

The piezoelectric composition of the layer P comprises at least one carbon black in a content of greater than or equal to 6% by volume, relative to the total volume of said composition.

Carbon black is elemental carbon in the form of colloidal particles produced by the partial combustion or by thermal decomposition of liquid or gaseous hydrocarbons under controlled conditions. It is used as a filler or colorant in many industrial applications.

Preferentially, the carbon black used in the context of the invention is a reinforcing carbon black. Within the meaning of the present invention, the term "reinforcing carbon black" is understood to mean a carbon black having capacities for reinforcing a rubber composition usable in particular for the manufacture of tyres. The carbon black which can be used in the present invention is therefore a reinforcing filler.

Surprisingly, when a carbon black is added to a piezoelectric composition based on an elastomer matrix comprising piezoelectric inorganic fillers, an improvement is observed in the piezoelectric properties of said composition compared to a composition not containing carbon black. This improvement in properties makes it possible for example to increase the viability of said composition or else to use smaller amounts of piezoelectric compositions for delivering the same electrical intensity, and thus to reduce the production costs or to miniaturize the devices in which the piezoelectric composition is used.

All carbon blacks, in particular the blacks conventionally used in tyres, are suitable as carbon blacks. Among the latter, mention will more particularly be made of the reinforcing carbon blacks of the 100, 200 and 300 series, or the blacks of the 500, 600 or 700 series (ASTM D-1765-2017 grades), such as, for example, the N115, N134, N234, N326, N330, N339, N347, N375, N550, N683 and N772 blacks. These carbon blacks can be used in the isolated state, as available commercially, or in any other form, for example as support for some of the rubber additives used. The carbon blacks might, for example, be already incorporated in the diene elastomer, in particular isoprene elastomer, in the form of a masterbatch (see, for example, applications WO97/36724-A2 and WO99/16600-A1).

More preferentially, the carbon black which can be used in the context of the present invention has an oil absorption number OAN of less than or equal to 154 ml/100 g, more preferentially within a range extending from 35 to 150 ml/100 g, more preferentially still extending from 70 to 140 ml/100 g.

More preferentially, the carbon black which can be used in the context of the present invention has a BET specific surface area of greater than 30 $m^2/g$, preferably within a range extending from 70 to 150 $m^2/g$, more preferentially still within a range extending from 70 to 120 $m^2/g$.

More preferentially still, the carbon black which can be used in the context of the present invention has an oil absorption number OAN within a range extending from 35 to 150 ml/100 g and a BET specific surface area within a range extending from 70 to 150 $m^2/g$.

The oil absorption number OAN is measured according to the standard D2414-2018 and the BET specific surface area according to the standard D6556-2017.

The content of carbon black in the piezoelectric composition of the layer P is greater than or equal to 6% by volume, relative to the total volume of said composition. Below this threshold, the improvements in the piezoelectric properties of the piezoelectric composition are not observed. Preferentially, the content of carbon black is greater than or equal to 6.5% by volume, and more preferentially greater than or equal to 7% by volume.

Preferentially, the layer P is an electrically insulating layer. Those skilled in the art will therefore know how to adapt the maximum amount of carbon black used depending on the use of the device of the invention. For this, those skilled in the art will know how to choose a maximum content of filler in order for the electrical conductivity of the layer P to be below the electrical percolation threshold of the fillers of the layer P for a value of the electric field used during the polarization step. Thus, preferentially, the content of carbon black may be less than or equal to 25% by volume, relative to the total volume of the piezoelectric composition, more preferentially less than or equal to 20% by volume, and more preferentially still less than or equal to 17% by volume. More preferentially still, the content of carbon black is within a range extending from 6% to 20% by volume, relative to the total volume of the piezoelectric composition.

Crosslinking System

The crosslinking system of the piezoelectric composition may be any known type of system. It may in particular be based on sulfur, and/or on peroxide and/or on bismaleimides.

According to a preferential embodiment, the crosslinking system is based on sulfur; it is then called a vulcanization system. The sulfur can be contributed in any form, in particular in the form of molecular sulfur or of a sulfur-donating agent. At least one vulcanization accelerator is also preferentially present, and, optionally, also preferentially, use may be made of various known vulcanization activators, such as zinc oxide, stearic acid or any equivalent compound, such as stearic acid salts, and salts of transition metals, guanidine derivatives (in particular diphenylguanidine), or also known vulcanization retarders.

When it is present, the sulfur is used at a preferential content of between 0.5 and 12 phr, in particular between 1 and 10 phr. The vulcanization accelerator is used at a preferential content of between 0.5 and 10 phr, more preferentially of between 0.5 and 5.0 phr.

Use may be made, as accelerator, of any compound capable of acting as accelerator of the vulcanization of diene elastomers in the presence of sulfur, in particular accelerators of the thiazole type, and also their derivatives, or accelerators of sulfenamide, thiuram, dithiocarbamate, dithiophosphate, thiourea and xanthate types. Mention may in particular be made, as examples of such accelerators, of the following compounds: 2-mercaptobenzothiazyl disulfide (abbreviated to "MBTS"), N-cyclohexyl-2-benzothiazole-sulfenamide ("CBS"), N,N-dicyclohexyl-2-benzothiazole-sulfenamide ("DCBS"), N-(tert-butyl)-2-benzothiazole-sulfenamide ("TBBS"), N-(tert-butyl)-2-benzothiazolesulfenimide ("TBSP"), tetrabenzylthiuram disulfide ("TBZTD"), zinc dibenzyldithiocarbamate ("ZBEC") and the mixtures of these compounds.

According to another preferential embodiment, the crosslinking system preferentially contains a peroxide. Advantageously, the peroxide is the only crosslinking agent. Thus, advantageously, according to this embodiment, the composition does not comprise a vulcanization system, that is to say a sulfur-based crosslinking system.

The peroxide which can be used in the context of the invention may be any peroxide known to those skilled in the art.

Preferably, the peroxide is selected from organic peroxides.

The term "organic peroxide" is understood to mean an organic compound, that is to say a compound containing carbon, comprising an —O—O— group (two oxygen atoms connected by a single covalent bond).

During the crosslinking process, the organic peroxide decomposes at its unstable O—O bond to give free radicals. These free radicals make possible the creation of the crosslinking bonds.

According to one embodiment, the organic peroxide is selected from the group consisting of dialkyl peroxides, monoperoxycarbonates, di acyl peroxides, peroxyketals, peroxyesters, and mixtures thereof.

Preferably, the dialkyl peroxides are selected from the group consisting of dicumyl peroxide, di(t-butyl) peroxide, t-butyl cumyl peroxide, 2,5-dimethyl-2,5-di(t-butylperoxy) hexane, 2,5-dimethyl-2,5-di(t-amylperoxy)hexane, 2,5-dimethyl-2,5-di(t-butylperoxy)hex-3-yne, 2,5-dimethyl-2,5-di (t-amylperoxy)hex-3-yne, α,α'-di[(t-butylperoxy)isopropyl] benzene, α,α'-di[(t-amylperoxy)isopropyl]benzene, di(t-amyl) peroxide, 1,3,5-tri[(t-butylperoxy)isopropyl]benzene, 1,3-dimethyl-3-(t-butylperoxy)butanol, 1,3-dimethyl-3-(t-amylperoxy)butanol, and mixtures thereof.

Some monoperoxycarbonates, such as OO-tert-butyl 0-(2-ethylhexyl) monoperoxycarbonate, OO-tert-butyl O-isopropyl monoperoxycarbonate, OO-tert-amyl O-(2-ethylhexyl) monoperoxycarbonate, and mixtures thereof, may also be used.

Among the diacyl peroxides, the preferred peroxide is benzoyl peroxide.

Among the peroxyketals, the preferred peroxides are selected from the group consisting of 1,1-di(t-butylperoxy)-3,3,5-trimethylcyclohexane, n-butyl 4,4-di(t-butylperoxy) valerate, ethyl 3,3-di(t-butylperoxy)butyrate, 2,2-di(t-amylperoxy)propane, 3,6,9-triethyl-3,6,9-trimethyl-1,4,7-triperoxynonane (or methyl ethyl ketone peroxide cyclic trimer), 3,3,5,7,7-pentamethyl-1,2,4-trioxepane, n-butyl 4,4-bis(t-amylperoxy)valerate, ethyl 3,3-di(t-amylperoxy) butyrate, 1,1-di(t-butylperoxy)cyclohexane, 1,1-di(t-amylperoxy)cyclohexane, and mixtures thereof.

Preferably, the peroxyesters are selected from the group consisting of tert-butyl peroxybenzoate, tert-butyl peroxy-2-ethylhexanoate, tert-butyl peroxy-3,5,5-trimethylhexanoate, and mixtures thereof.

Particularly preferably, the organic peroxide is selected from the group consisting of dicumyl peroxide, aryl or diaryl peroxides, diacetyl peroxide, benzoyl peroxide, dibenzoyl peroxide, di(tert-butyl) peroxide, tert-butyl cumyl peroxide, 2,5-bis(tert-butylperoxy)-2,5-dimethylhexane, n-butyl 4,4'-di(tert-butylperoxy)valerate, OO-(t-butyl) 0-(2-ethylhexyl) monoperoxycarbonate, tert-butyl peroxyisopropyl carbonate, tert-butyl peroxybenzoate, tert-butyl peroxy-3,5,5-trimethylhexanoate, 1,3(4)-bis(tert-butylperoxyisopropyl)benzene, and mixtures thereof, more preferentially selected from the group consisting of dicumyl peroxide, n-butyl 4,4'-di(tert-butylperoxy)valerate, OO-(t-butyl) 0-(2-ethylhexyl) monoperoxycarbonate, tert-butyl peroxyisopropyl carbonate, tert-butyl peroxybenzoate, tert-butyl peroxy-3,5,5-trimethylhexanoate, 1,3(4)-bis(tert-butylperoxyisopropyl) benzene, and mixtures thereof.

When it is present, the total content of peroxide in the composition is preferably greater than or equal to 0.3 phr, more preferentially greater than or equal to 0.75 phr, preferably within a range extending from 0.5 to 5 phr, in particular from 0.5 to 3 phr.

Other Additives

The piezoelectric composition of the layer P of the device according to the invention may optionally also comprise one or more additives, such as, for example, pigments, protective agents, such as antiozone waxes, chemical antiozonants, antioxidants, plasticizing agents, such as plasticizing oils or hydrocarbon resins, reinforcing resins, or methylene acceptors (for example novolak phenolic resin) or donors (for example HMT or H3M).

Advantageously, the piezoelectric composition of the layer P does not comprise graphitized or partially graphitized carbon black. Within the meaning of the present invention, the term "graphitized or partially graphitized black" is understood to mean a carbon black comprising graphite and having an oil absorption number of greater than or equal to 155 ml/100 g. In the case where graphitized or partially graphitized carbon black is also present in this composition of the layer P, the content of this graphitized or partially graphitized carbon black is preferentially chosen by those skilled in the art so that the piezoelectric composition remains electrically insulating. Thus, preferentially, the content of graphitized or partially graphitized carbon black is less than or equal to 5% by volume, relative to the total volume of the piezoelectric composition.

Manufacture of Layer P

The layer P of the device of the invention can be manufactured by any known technique.

In general, the piezoelectric inorganic fillers are dispersed in the elastomer matrix in the presence of the carbon black usable in the context of the present invention, and the composition obtained from the preceding step is optionally crosslinked.

The dispersion of the piezoelectric inorganic fillers in the elastomer matrix in the presence of carbon black usable in the context of the present invention is carried out by any means known per se to those skilled in the art, in particular for example by twin-screw extrusion or by mixing in an internal mixer.

By way of example, the layer P is manufactured in an appropriate mixer, using, for example, two successive phases of preparation according to a general procedure well known to those skilled in the art: a first phase of thermo-mechanical working or kneading (sometimes described as "non-productive" phase) of the diene elastomer, the piezo-electric inorganic filler and the carbon black, and also any other ingredients possibly present except for the crosslinking system, at high temperature, up to a maximum temperature of between 80° C. and 190° C., preferably between 80° C. and 150° C., followed by a second phase of mechanical working (sometimes described as "productive" phase) at lower temperature, typically below 80° C., for example between 60° C. and 80° C., during which finishing phase the crosslinking system is incorporated into the mixture obtained in the non-productive phase, then, at the end of the productive phase, extruding or calendering the composition obtained to form the layer P.

Layer E Forming an Electrode

The electrodes are known to those skilled in the art. They are deposited on the faces of the layer P in order to collect the electric charges emitted by the piezoelectric composition of this layer P. They can be opposite one another. Their dimensions are adapted to the envisaged application.

The electrodes may be made of metal or metal oxides in the form of a thin deposit of these metals or these metal oxides. For example, the electrodes may be made of indium tin oxide, of a metal material, such as silver, gold, nickel, palladium, aluminium, copper, titanium, or an alloy or a mixture of at least two of these materials. Metal or metal oxide electrodes may be formed by a so-called additive process, for example by direct printing of a fluid or viscous composition comprising the metal or the metal oxide form-ing the electrodes, at the desired locations, for example by inkjet printing, heliography, screen printing, flexography, spray coating, drop-casting or by chemical vapour deposi-tion. The formation of the metal or metal oxide electrodes may correspond to a subtractive process in which the material forming the electrodes is deposited over all of the layer P and in which the unused portions are then removed by photolithography or laser ablation, for example. Depend-ing on the metal material under consideration, the deposition over all of the layer P may be carried out via the liquid route, by cathode sputtering or by evaporation.

The electrodes may be flexible, such as a mixture of thermoplastic or diene elastomers rendered conductive, or such as a conductive polymer, for instance poly(3,4-ethyl-enedioxythiopene).

As flexible electrodes, use may for example be made of a layer E comprising a conductive rubber composition based on at least 50 phr of diene elastomer, on a crosslinking system and on a graphitized or partially graphitized carbon black.

The diene elastomers suitable for the conductive rubber composition of the layer E are those described above for the piezoelectric composition of the layer P. The diene elastomer of the conductive rubber composition of the layer E may be identical to or different from that of the piezoelectric com-position of the layer P; preferably, it is identical to that of the piezoelectric composition of the layer P.

The crosslinking system suitable for the conductive rub-ber composition of the layer E is that described above for the piezoelectric composition of the layer P. The crosslinking system of the conductive rubber composition of the layer E may be identical to or different from that of the piezoelectric composition of the layer P; preferably, it is identical to that of the piezoelectric composition of the layer P.

The graphitized or partially graphitized carbon black is any graphitized or partially graphitized carbon black having an oil absorption number OAN of greater than or equal to 155 ml/100 g, more preferentially greater than or equal to 160 ml/100 g.

Preferably, the graphitized or partially graphitized carbon black may have a particle size within a range extending from 50 to 500 μm. The amount of graphitized or partially graphitized carbon black in the conductive rubber compo-sition of the layer E is within a range extending from 10% to 40% by volume, preferably from 15% to 30% by volume, relative to the total volume of the conductive rubber com-position. Preferentially, the conductive rubber composition of the layer E does not comprise any piezoelectric inorganic filler.

The conductive rubber composition of the layer E is manufactured in an appropriate mixer, using, for example, two successive phases of preparation according to a general procedure well known to those skilled in the art: a first phase of thermomechanical working or kneading (sometimes described as "non-productive" phase) at high temperature, in which are mixed the constituents of the layer E except for the crosslinking system, up to a maximum temperature of between 80° C. and 190° C., preferably between 80° C. and 150° C., followed by a second phase of mechanical working (sometimes described as "productive" phase) at lower tem-perature, typically below 80° C., for example between 60° C. and 80° C., during which finishing phase the crosslinking system is incorporated. At the end of the productive phase, the conductive rubber composition is extruded or calendered to form a flexible layer E.

Manufacture of the Device of the Invention

The device of the invention may be manufactured any means known to those skilled in the art. The layers E forming the electrodes are deposited on the faces of the layer P comprising the piezoelectric composition in order to collect the electric charges emitted by said composition. The device according to the invention is advantageously con-nected to an electronic member in order to capture the electrical pulses emitted and to use this information.

As an example of manufacturing the device with flexible layers E, mention may be made of the following protocol: the layers E and P can be manufactured separately as explained above, and then the layer P comprising the piezo-electric composition is placed between two, identical or different, preferably identical, conductive layers E to obtain an assembly, and then pressure is applied to the assembly and the assembly is crosslinked to obtain the device accord-ing to the invention. The layers may be successively depos-ited in a suitable mould, known as curing mould, which can have any dimensions. It is possible to use a pressure ranging from 1 000 000 to 20 000 000 Pa, advantageously ranging from 1 500 000 to 10 000 000 Pa. This pressure is applied to the assembly. The duration of the compression is adjusted according to the chosen pressure; it may for example last from 5 min to 90 min. The crosslinking may be carried out by curing, that is to say by heating the assembly to a temperature generally of between 130° C. and 200° C., for a sufficient time which can vary, for example, between 5 and 90 min depending in particular on the curing temperature, on the crosslinking system adopted and on the crosslinking kinetics of the compositions under consideration. The steps of applying pressure and of crosslinking may be simultane-ous. For example, when the layers are deposited in a curing mould, this mould can be deposited in a plate press, where the assembly will be cured under pressure. In an alternative form of the device, the elastomer of the composition of the layer P may be co-crosslinked with the diene elastomer of each composition of the flexible diene layer E. Thus, the various layers may be advantageously bonded together covalently, making it possible to obtain a device which is cohesive.

When the layers E are metal layers, the layer P may be manufactured as explained above, and then the layers E are applied according to one of the processes for manufacturing these layers as explained above.

The process for preparing the device of the invention may advantageously comprise a step of polarization. The step of polarization of the device corresponds to the application of an electric field to the terminals of the electroactive device in order to orient the dipoles of the piezoelectric inorganic fillers in the same direction in order to obtain a macroscopic polarization of the device.

The step of polarization of the piezoelectric inorganic fillers is carried out by known means suitable for converting the piezoelectric inorganic fillers into fillers exhibiting piezoelectric properties on a macroscopic scale. The step of polarization of the device thus corresponds to the application of an electric field to the terminals of the electroactive device in order to orient the dipoles of the piezoelectric inorganic fillers in the same direction in order to obtain a macroscopic polarization of the piezoelectric composition.

The polarization depends on the polarization temperature, on the electric field applied and on the polarization time.

Advantageously, the polarization temperature can be at least lower by 5° C. with respect to the lowest Curie temperature, Tc, of the piezoelectric inorganic fillers, more advantageously at least 7° C. less, more advantageously still at least 10° C. less, than the lowest Curie temperature, Tc, of the piezoelectric inorganic fillers. This is because, close to the Curie temperature of the piezoelectric inorganic fillers, the agitation of the dipoles makes it more difficult to align them under an electric field.

The Curie temperature, Tc, of a piezoelectric material corresponds to the temperature at which the material becomes paraelectric. Thus, the characteristic hysteresis cycle of the piezoelectric material, which is obtained by plotting the polarization as a function of the electric field applied to the material, disappears when the Curie temperature is reached. The Curie temperature is a characteristic of the piezoelectric material.

In particular, the electric field applied during the polarization step can be within a range extending from 0.1 to 10 kV/mm, advantageously from 0.5 to 5 kV/mm.

In particular, the electric field applied depends on the nature of the piezoelectric inorganic filler and on the polarization time of the piezoelectric composition and on the content of carbon black present in the piezoelectric composition. Those skilled in the art know how to adapt the electric field to the device of the invention and to the polarization time.

In particular, the polarization time can be between 1 minute and 10 hours, preferably between 5 minutes and 2 hours.

Use of the Device According to the Invention

The device according to the invention and mentioned above can be used in combination with a sensor.

The device of the invention enables the detection of a mechanical stress at the surface of said piezoelectric composition by direct piezoelectric effect. The detection of a mechanical stress may be carried out in a very wide range of technical applications such as in the aeronautical industry, the motor vehicle industry, the health sector, tyres, the transport sector, and the like.

Another subject of the invention is a tyre comprising the device mentioned above comprising said piezoelectric composition and electrodes. In particular, said device may be fixed for example on the inner airtight layer of said tyre, that is to say on the layer which is in contact with the air with which the tyre is inflated. The fixing may be achieved by conventional means known to those skilled in the art such as the scraping off of the lining cement, the use of cold vulcanization or else the melting of TPE. The fixing can be carried out by adhesive bonding with an adhesive.

Other advantages will become apparent on reading the following description, which refers to the examples given in a nonlimiting manner.

EXAMPLES

The aim of the test presented below is to compare the piezoelectric properties of the piezoelectric composition C1, in accordance with the invention, which forms the layer P of the device of the invention, with respect to a device having the same electrodes but having a layer P of a non-conforming piezoelectric composition T.

Unless stated otherwise, the contents of the various constituents of the piezoelectric composite materials presented in Table 1 are expressed in phr (part by weight per 100 parts by weight of elastomer).

TABLE 1

| Material | T | C1 |
| --- | --- | --- |
| Elastomer matrix (1) | 100.00 | 100.00 |
| Piezoelectric inorganic filler (2) in phr | 320.10 | 362.40 |
| Piezoelectric inorganic filler (2) in % by volume | 33% | 33% |
| Carbon black (3) in phr | (—) | 25.0 |
| Carbon black (3) in % by volume | 0 | 7.7 |
| Crosslinking system (4) | 0.75 | 0.75 |

(1) Elastomer matrix: Non-functional, non-extended, styrene/butadiene (SBR) copolymer polymerized in solution (S-SBR). Its microstructure is as follows: 24 mol % of 1,2-polybutadiene units relative to the butadiene part and 26.5% by weight of styrene units relative to the total weight of the copolymer. It has a Tg=−48° C. The glass transition temperature, Tg, is measured in a known way by DSC (Differential Scanning calorimetry) according to the standard ASTM D3418 of 1999. The microstructure of the S-SBR (relative distribution of 1,2-vinyl, trans-1,4- and cis-1,4-butadiene units) and the quantitative determination of the content by weight of styrene in the S-SBR are determined by near-infrared (NIR) spectroscopy. The principle of the method is based on the Beer-Lambert law generalized for a multicomponent system. As the method is indirect, it involves a multivariate calibration [Vilmin, F., Dussap, C. and Coste, N., Applied Spectroscopy, 2006, 60, 619-29] carried out using standard elastomers having a composition determined by $^{13}C$ NMR. The styrene content and the microstructure are then calculated from the NIR spectrum of an elastomer film approximately 730 μm in thickness. The spectrum is acquired in transmission mode between 4000 and 6200 cm$^{-1}$ with a resolution of 2 cm$^{-1}$ using a Bruker Tensor 37 Fourier-transform near-infrared spectrometer equipped with an InGaAs detector cooled by the Peltier effect.

(2) Piezoelectric inorganic filler: $BaTiO_3$: average diameter of the fillers: 500 nm, density 5.85 g/cm$^3$, sold by Inframat Advanced Materials.

(3) Carbon black: Reinforcing carbon black N347 (ASTM D1765-2017) sold by Cabot, having an OAN=124 ml/100 g measured according to the standard D2414-2018 and a BET specific surface area=85 $m^2$/g measured according to the standard D6556-2017.

(4) Crosslinking system: Luperox 231 (1,1-di(t-butylperoxy)-3,3,5-trimethylcyclohexane supported at 40% by weight on calcium carbonate) sold by Arkema.

Process for the Preparation of the Piezoelectric Compositions

The piezoelectric compositions are prepared in an 85 $cm^3$ Polylab internal mixer, filled to 70%, the initial vessel temperature of which is 80° C., the elastomer matrix, the piezoelectric inorganic fillers and the carbon black for the piezoelectric composition C1. Then, thermomechanical working is carried out for 3 min at 80 revolutions/min, until a maximum dropping temperature of 150° C. is reached (non-productive phase). The mixture thus obtained is recovered, it is cooled and then the crosslinking system is added on an external mixer (homofinisher) at a temperature of 25° C., the whole being mixed in 12 cross-passes (productive phase). The materials thus obtained are then calendered in the form of plaques (thickness of 2 to 3 mm) and cured using a press at 150° C. for 20 minutes in a 330 $cm^2$ mould under 8 tonnes.

On conclusion of this operation, it is entirely possible to cut out the laminates with a hollow punch or any other cutting means in order to produce a piezoelectric device with its two electrodes having the shape and the size desired.

The device is then prepared. More precisely, 20 mm×80 mm×2 mm (width×length×thickness) parallelepipeds (also called test specimens hereinafter) are then cut out from the previously obtained plaques. To facilitate the polarization and to enable the measurements, the test specimens are metallized on the two faces having the greatest dimensions. The metallization, in this case with gold, may be carried out manually with a lacquer or by cathode sputtering or any other known method. In this case, a metallizer (Denton Desk V from Denton Vacuum) is used to deposit the two gold electrodes with an amperage of 40 mA for 25 seconds.

The device is then placed into a bath of silicone oil (Bluesil FLD 47V5000 sold by Bluestar Silicones) for the polarization step. An MCP Lab Electronics SPN6000A electrical generator is used to apply an electric field for 10 minutes to both terminals of the test specimen (i.e. connected to the two metallized faces). The polarization is carried out at a temperature of 60° C. Two intensities of direct electric field are used: 1 V/μm (condition A) and 4 V/μm (condition B). Once polarized, the test specimens are short-circuited in order to discharge a maximum of residual charges.

Measurement of the Piezoelectric Coefficient $d_{33}$:

The piezoelectric coefficient $d_{33}$ makes it possible to determine the deformation capacity of a piezoelectric composition, this deformation taking place parallel to the axis of polarization.

The measurement of the electromechanical response of the test specimens is performed on a dynamic measurement bench. The sample is prestressed with a force of 10 N and then it is subjected to compressive stress with a force of 5 N at a frequency of 1 Hz and at a temperature of 23° C.

The signal generated by the piezoelectric composition is recovered at the terminals of the sample by a specific jaws platform, then amplified and measured on an oscilloscope.

The charge Q (pC or picocoulomb) released at each mechanical stressing is deduced from the peak-to-peak voltage read on the oscilloscope. Thus, the piezoelectric coefficient $d_{33}$ (pC/N (picocoulomb/newton)) can be calculated. The coefficient $d_{33}$, known to those skilled in the art, represents the piezoelectric coefficient measured by application of a stress in the direction parallel to the direction of polarization of the sample. In the case of a parallelepipedal sample, the direction of polarization corresponds to the smallest thickness (direction 3) and the stress is applied along the same thickness (direction 3).

The following notation can be adopted:

$$d_{33} = \Delta P3/\Delta\sigma3,$$

with $\Delta P3$ the macroscopic polarization variation in the direction 3 and $\Delta\sigma3$ the stress applied in the direction 3.

This coefficient is calculated by the following formula:

$$d_{33} = [Q \text{ (pC)} \times \text{thickness (m)}]/[\text{Force (N)} \times \text{Length (m)}]$$

in the case where the electrode covers the entire surface of the test specimen.

Results

Table 2 shows the results of measurement of the piezoelectric coefficient $d_{33}$ for the piezoelectric composition of the invention compared to that of the control, measured after a polarization according to condition A or condition B.

TABLE 2

| Piezoelectric coefficient $d_{33}$ | T | C1 |
| --- | --- | --- |
| Condition A: 1 V/μm | 0.1 | 0.3 |
| Condition B: 4 V/μm | 0.7 | 1.7 | n.m. = short circuit during polarization.

The results in Table 2 show that, for a given polarization condition, for example condition A, the piezoelectric coefficient $d_{33}$ of the piezoelectric composition C1 according to the invention is very significantly improved compared to that of the piezoelectric composition T not according to the invention. This coefficient increases by at least a factor of 300% (comparison C1 versus T condition A). The carbon black therefore makes it possible, surprisingly, to improve the piezoelectric properties of a piezoelectric composition in which it is added, after polarization under the same conditions of temperature, time, and intensity of the electric field as a piezoelectric composition not comprising any carbon black.

The invention claimed is:

1. A piezoelectric device comprising at least one piezoelectric layer P interposed between two conductive layers E, each layer E forming an electrode, wherein the layer P comprises at least one piezoelectric composition based on at least one elastomer matrix comprising predominantly at least one diene elastomer, a piezoelectric inorganic filler, a carbon black and a crosslinking system, and wherein a content of piezoelectric inorganic filler is greater than or equal to 5% by volume, relative to a total volume of the at least one piezoelectric composition, and a content of carbon black is greater than or equal to 6% by volume, relative to the total volume of the at least one piezoelectric composition.

2. The piezoelectric device according to claim 1, wherein the carbon black is a reinforcing carbon black.

3. The piezoelectric device according to claim 1, wherein the carbon black has an oil absorption number OAN of less than or equal to 154 ml/100 g.

4. The piezoelectric device according to claim 1, wherein the carbon black has a BET specific surface area of greater than 30 $m^2$/g.

5. The piezoelectric device according to claim 1, wherein the content of piezoelectric inorganic filler is within a range extending from 5% to 80% by volume, relative to the total volume of the at least one piezoelectric composition.

6. The piezoelectric device according to claim 1, wherein the piezoelectric inorganic filler is selected from piezoelectric ceramics.

7. The piezoelectric device according to claim 1, wherein the piezoelectric inorganic filler is selected from the group consisting of barium titanate, lead titanate, lead zirconate titanate, lead niobate, lithium niobate, potassium niobate, and mixtures thereof.

8. The piezoelectric device according to claim 1, wherein the at least one diene elastomer of the at least one piezoelectric composition is selected from the group consisting of natural rubber, ethylene/propylene/diene monomer copolymers, synthetic polyisoprenes, polybutadienes, butadiene copolymers, isoprene copolymers, and mixtures thereof.

9. The piezoelectric device according to claim 1, wherein the crosslinking system comprises a peroxide.

10. The piezoelectric device according to claim 1, wherein each layer E is a conductive metal layer.

11. The piezoelectric device according to claim 1, wherein each layer E is a conductive rubber composition based on at least 50 phr of diene elastomer, a graphitized or partially graphitized carbon black and a crosslinking system.

12. The piezoelectric device according to claim 11, wherein the crosslinking system of the conductive rubber composition of the layer E comprises a peroxide.

13. The piezoelectric device according to claim 11, wherein the at least one diene elastomer of the piezoelectric composition of the layer P is co-crosslinked with the diene elastomer of the conductive rubber composition of each layer E.

14. The piezoelectric device according to claim 11, wherein the graphitized or partially graphitized carbon black has an oil absorption number OAN of greater than or equal to 155 ml/100 g.

15. A tire comprising at least one piezoelectric device according to claim 1.

* * * * *